(12) United States Patent
Kim

(10) Patent No.: US 6,808,649 B1
(45) Date of Patent: Oct. 26, 2004

(54) SOFT PIEZOELECTRIC CERAMIC COMPOSITION AND PIEZOELECTRIC DEVICE USING THE SAME

(75) Inventor: Young Min Kim, Kyungki-Do (KR)

(73) Assignee: Dongil Technology Co. Ltd., Kyungki-Do (KR)

(*) Notice: Subject to any disclaimer, the term of this patent is extended or adjusted under 35 U.S.C. 154(b) by 0 days.

(21) Appl. No.: 10/293,882

(22) Filed: Nov. 13, 2002

(51) Int. Cl.$^7$ .............................................. C04B 35/493

(52) U.S. Cl. .................. 252/62.9 PZ; 310/364; 501/135; 501/136; 501/134

(58) Field of Search ..................... 310/364; 501/134, 501/135, 136; 252/62.9 PZ

(56) References Cited

U.S. PATENT DOCUMENTS 3,434,122 A * 3/1969 Land et al. ........... 252/62.9 PZ

OTHER PUBLICATIONS

Derwent abstract for SU 528284, Oct. 1, 1976.*
Derwent abstract for SU 1073227, Feb. 15, 1984.*
Derwent abstrct for SU 1502537, Aug. 23, 1989.*

* cited by examiner

Primary Examiner—C. Melissa Koslow
(74) Attorney, Agent, or Firm—Thomas R. Vigil; Welsh & Katz, Ltd.

(57) ABSTRACT

The soft piezoelectric ceramic composition is a soft piezoelectric ceramic composition sinterable at a reduced temperature with high piezoelectric parameters and is used in a piezoelectric device. Preferably the soft piezoelectric ceramic composition comprises:

$$[(Pb_{1-m-n}Sr_mBa_n)_{(1-y)}Bi_y[](Zr_xTi_{1-x})_{1-a-b}Ni_aW_b]O_3+pCdO$$

wherein m,n,x,y,a and b are molar ratio, p is wt % and are in ranges, repectively, $$0.00 \leq m < 0.18, 0.00 \leq n \leq 0.18, 0.00 \leq (m+n) \leq 0.21, 0.40 \leq x \leq 0.60$$
$$0.00 < y < 0.04, 0.00 \leq a \leq 0.02, 0.00 < b \leq 0.02, 0.00 < p \leq 2.00.$$

The soft piezoelectric ceramic composition has high piezoelectric constants and electromechanical coupling coefficients and can be sintered at a reduced temperature below 1000° C. Further, the soft piezoelectric ceramic materials can be co-fired with pure Ag electrode below 960° C. Based on the piezoelectric ceramic compositions provided, multilayer piezoelectric actuators are built with pure Ag internal electrode, saving a cost of electrode as much as 90% compared to Ag—Pd (30%) internal electrode.

14 Claims, 3 Drawing Sheets

SOFT PIEZOELECTRIC CERAMIC COMPOSITION AND PIEZOELECTRIC DEVICE USING THE SAME

BACKGROUND OF THE INVENTION

1. Field of Invention

The present invention relates to a soft piezoelectric ceramic composition and, more particularly, to a soft piezoelectric ceramic composition sinterable at a reduced temperature with high piezoelectric parameters and a piezoelectric device using the same.

2. Description of the Prior Art

With a successful application of piezoelectric actuators for valve control of fuel injection system in diesel engine, multi-layer piezoelectric actuators finally find a major application. Soft PZT (lead zirconium titanate, $Pb(Zr\ Ti)O_3$) materials with a big piezoelectric constant, $d_{33}$, are generally used for piezoelectric actuators to get a larger displacement. Monolithic multi-layered structures are always chosen to get a sufficient displacement at a low input voltage as in automobiles.

When producing multi-layer piezoelectric actuators with conventional soft PZT materials, expensive Ag—Pd or Pt alloys are usually used for internal electrodes due to a high cofiring temperature. Pd contents are dependent on the cofiring temperature and usually in the range of 20~70% by weight when sintering at 1150~1300° C. Therefore, there is a big technical push to decrease sintering temperature of piezoelectric ceramics, preferably below the melting point of Ag (Silver), to reduce a cost of internal electrodes in multi-layer piezoelectric actuators.

Soft piezoelectric ceramic materials have typical characteristics of:
high piezoelectric constant
high electromechanical coupling coefficient, Kp
high dielectric constant
high dielectric loss
low mechanical quality factor, and
high residual polarization with a low coercive field.

In PZT based materials, these properties are achieved by substituting ($Zr^{4+}$ or $Ti^{4+}$) with ions of a higher valence such as $Nb^{5+}$, $Ta^{5+}$, $W^{6+}$, etc. or by substituting $Pb^{2+}$ with $La^{3+}$. However, sintering temperature of conventional soft piezoelectric ceramic materials are in the range of 1150~1200° C. (Refer to the following: 1) H. Zheng et. al., "Effects of Octahedral Tilting on the Piezoelectric Properties of Strontium/Barium/Niobium-doped Soft Lead Zirconate Titanate Ceramics", J. of Am. Ceram. Soc. 85[9], 2337 (2002). 2) U.S. Pat. No. 5,423,995) Therefore, expensive Ag—Pd alloys have to be used to build multi-layered piezoelectric actuators by cofiring green sheets with internal electrodes.

Sintering temperature of PZT materials can be lowered by adding sintering aids such as $B_2O_3$, $V_2O_5$, $Bi_2O_3$, CuO, which form liquid phase enhancing densification at a reduced temperature. (Refer to the followings; 1)U.S. Pat. No. 5,423,995, 2)U.S. Pat. No. 5,433,917, 3)U.S. Pat. No. 5,792,379, 4) K. Murakami et. al. "Morphotropic Phase Boundary and Microstructure of Low-Temperature sintered PZT ceramics with $BiFeO_3$ and $Ba(Cu_{0.5}W_{0.5})O_3$". Proceedings of the Ninth IEEE International Symposium on Applications of Ferroelectrics 5) X. Wang et. al., "The Mechanism of Low Temperature Sintering PZT Ceramics with additives of $Li_2O_3$—$Bi_2O_3$—CdO", Proceedings of Eighth IEEE International Symposium on Applications of Ferroelectrics.)

However, these sintering aids often remain as glassy phases in the sintered ceramics, increasing dielectric loss tangent and deteriorating piezoelectric parameters. In addition, these liquid phases formed during sintering react easily with Ag or Ag/Pd electrode and make it difficult to cofire multi-layered piezoceramic elements.

BRIEF SUMMARY OF THE INVENTION

The present invention is intended to solve the above-described problems of the conventional techniques.

Therefore, an object of the present invention is to provide soft piezoelectric ceramic composition which can be sintered at a reduced temperature, preferably further below the melting point of pure Ag so that they can be co-fired with pure Ag electrode.

Another object of the present invention is to produce piezoelectric device using the same materials.

Still another object of the present invention is to produce multi-layered piezoelectric device using the same materials.

In achieving the above objects, the soft piezoelectric ceramic composition according to the present invention includes: $[(Pb_{1-m-n}Sr_mBa_n)_{(1-y)}Bi_y][(Zr_xTi_{1-x})_{1-a-b}Ni_aW_b]O_3+pCdO$, wherein m, n, x, y, a and b are molar ratio, p is wt % and are in ranges, respectively, $0.00\% \leq m \leq 0.18$, $0.00 \leq n \leq 0.18$, $0.00 \leq (m+n) \leq 0.21$, $0.40 \leq x \leq 0.60$
$0.00 \leq y \leq 0.04$, $0.00 \leq a \leq 0.02$, $0.00 < b < 0.02$, $0.00 < p \leq 2.00$.

In another aspect of the present invention, the piezoelectric ceramic device according to the present invention comprises: a piezoelectric ceramic comprising said piezoelectric ceramic composition, sintered below 980° C.

In still another aspect of the present invention, the multi-layered piezoelectric ceramic device according to the present invention comprises: a piezoelectric ceramic layer, wherein the piezoelectric ceramic layer comprising said piezoelectric ceramic composition, co-fired with pure Ag internal electrode below 960° C.

In still another aspect of the present invention, the multi-layered piezoelectric ceramic device according to the present invention comprises: a piezoelectric ceramic layer, wherein the piezoelectric ceramic layer comprising said piezoelectric ceramic composition, co-fired with Ag—Pd internal electrode below 1050° C.

According to this invention, it is possible to provide soft piezoelectric ceramic composition which have high piezoelectric constants and electromechanical coupling coefficients and which can be sintered at a reduced temperature below 1000° C. and further soft piezoelectric ceramic materials which can be co-fired with pure Ag electrode below 960° C.

Based on the piezoelectric ceramic compositions according to this invention, multi-layer piezoelectric actuators are built with pure Ag internal electrode, saving a cost of electrode as much as 90% compared to Ag—Pd (30%) internal electrode.

BRIEF DESCRIPTION OF THE SEVERAL VIEWS OF THE DRAWINGS

The above objects and other advantages of the present invention will become more apparent by describing in detail the preferred embodiment of the present invention with reference to the attached drawings in which.

DETAILED DESCRIPTION OF THE INVENTION

Figure 1:
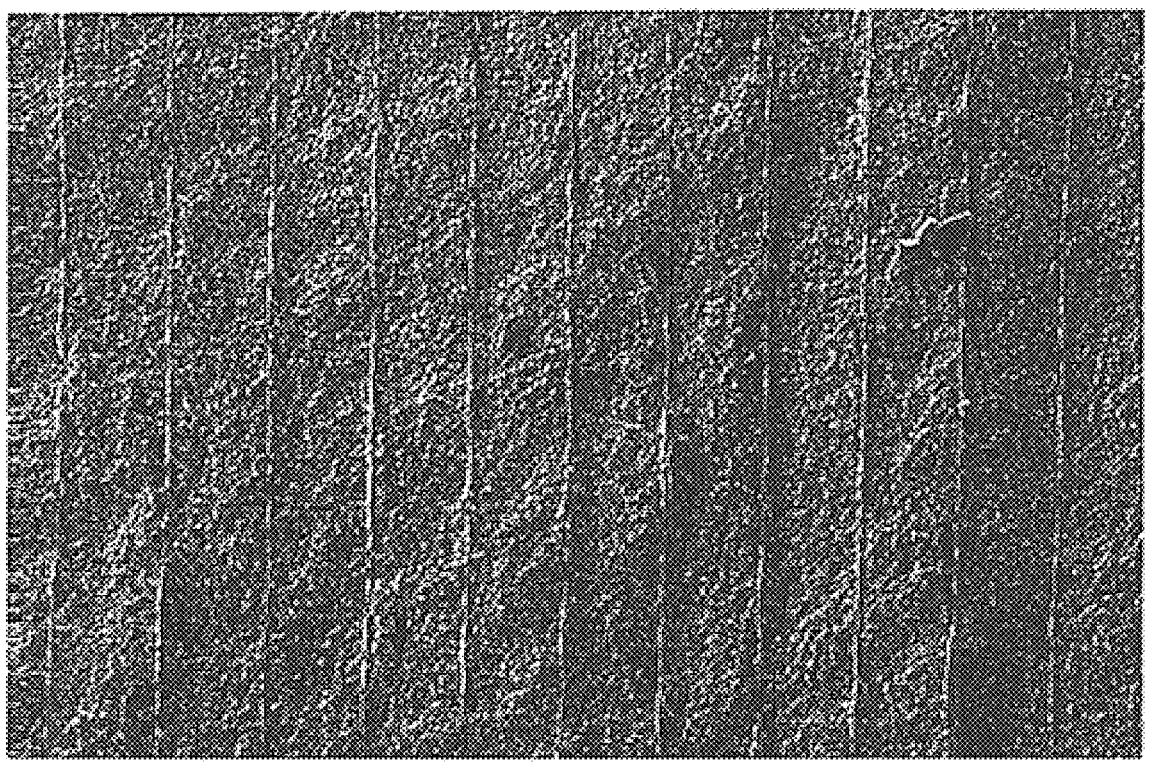
FIG. 1. is the cross-sectional view of multi-layered piezoelectric plates co-fired with pure Ag internal electrode.

The soft piezoelectric ceramic composition according to the present invention includes:

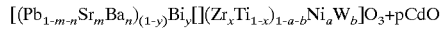

$[(Pb_{1-m-n}Sr_mBa_n)_{(1-y)}Bi_y][(Zr_xTi_{1-x})_{1-a-b}Ni_aW_b]O_3 + pCdO$ wherein m, n, x, y, a and b are molar ratio, p is wt % and are in ranges, respectively, $0.00 \leq m \leq 0.18, 0.00 \leq n \leq 0.18, 0.00 \leq (m+n) \leq 0.21, 0.40 \leq x \leq 0.60$
$0.0 < y \leq 0.04, 0.00 \leq a \leq 0.02, 0.00 < b \leq 0.02, 0.00 < p \leq (2.00.$ In the component $[(Pb_{1-m-n}Sr_mBa_n)_{(1-y)}Bi_y][(Zr_xTi_{1-x})_{1-a-b}Ni_aW_b]O_3$ of the piezoelectric ceramic composition according to the present invention, ($Sr^{2+}$ and/or $Ba^{2+}$) and $Bi^{3+}$ substitute for $Pb^{2+}$ and ($Ni^{2+}$ and $W^{6+}$) substitute for ($Zr^{4+}$ or $Ti^{4+}$) to Pb(Zr, Ti)$O_3$ basic matrix. Sr and/or Ba increase dielectric constant without much altering the coupling factor and elastic modulus and thus raise piezoelectric constant, $d_{33}$, accompanied by a decrease of Curie temperature. $Bi^{3+}$ substitution for $Pb^{2+}$ or $W^{6+}$ substitution for ($Zr^{4+}$ or $Ti^{4+}$) generate vacancies in $Pb^{2+}$ sites of PZT and imparts all the piezoelectric characteristics of soft piezoelectric ceramics: high piezoelectric constant, high electro-mechanical coupling coefficient, high dielectric loss, low mechanical quality factor. Substitution of $O^{2-}$ with $F^-$ also introduces vacancies in $Pb^{2+}$ sites. $Ni^{2+}$ increases piezoelectric parameters and affects maximum amount of $W^{6+}$ to be added from its difference in size and valence state compared to $W^{6+}$.

$Bi^{3+}$ forms so-called transient liquid phase which enhances densification effectively in the early stage of sintering at a lower temperature but largely incorporates into the matrix of piezoelectric ceramics at the end of sintering process without a significant deterioration of piezoelectric parameters.

In order to get piezoelectric parameters such as $d_{33}$, $k_p$, etc, to a practical level as soft piezoelectric ceramic materials with sintering at a reduced temperature, the amount of each substituent or additive is limited to the following level:
the amount of $Bi^{3+}$, y, less than or equal to 0.04 molar ratio, the amount of $Ni^{2+}$, a, 0 to 0.02 molar ratio, the amount of $W^{6+}$, b, less than or equal to 0.02 molar ratio and the amount of CdO, p less than or equal to 2 weight percent. Beyond these levels, piezoelectric parameters, $d_{33}$ or electro-mechanical parameters decrease too much for a practical use as soft piezoelectric ceramics. Desirably, the ratio of y, a and b is 1: 0.5~1: 0.33~0.5.

The amount of Sr or Ba, m or n take any value of 0.00 to 0.18 molar ratio with the sum of both less than or equal to 0.21 molar ratio in accordance with dielectric constant and Curie point required. Relative amount of Zr over Ti can take any value of 0.40 to 0.60 molar ratio to optimize necessary piezoelectric parameters such as $d_{33}$, $k_p$, temperature coefficient of dielectric constant or resonant frequency.

The soft piezoelectric ceramic composition according to the present invention includes CdO as sintering aids. Preferably, further comprises at least one sintering aid selected from the group consisting of PbO and LiF.

These sintering aids form transient liquid phase with $Bi_2O_3$ at a low temperature and aid densification during sintering. All the elements in sintering aids or $Bi_2O_3$ have a certain solubility in PZT matrix and a large part of the materials in transient liquid phase will be incorporated into the PZT matrix in the later stage of sintering and thus it does not deteriorate piezoelectric parameters seriously.

Sintering aids form so-called transient liquid phase which enhances densification effectively in the early stage of sintering at a lower temperature but largely incorporates into the matrix of piezoelectric ceramics at the end of sintering process without a significant deterioration of piezoelectric parameters.

Desirably, the amount of CdO is less than or equal to 2 wt %. Desirably, the amount of PbO is less than or equal to 2 wt % and the amount LiF is less than or equal to 1.6 wt %. Beyond these levels, piezoelectric parameters, $d_{33}$ or electromechanical parameters decrease too much for a practical use as soft piezoelectric ceramics.

Main substitutions and sintering aids to impart soft piezoelectric characteristics and to decrease sintering temperature are especially chosen not to deteriorate piezoelectric parameters significantly or not to induce serious reaction with Ag or Ag/Pd internal electrode during cofiring.

The present invention is better understood with the following examples of ceramic compositions and an example of multi-layer stacks made of the same materials.

EXAMPLE 1

Soft Piezoelectric Ceramic Composition

PbO, $ZrO_2$, $TiO_2$, $SrCO_3$, $BaCO_3$, CdO, $Bi_2O_3$ and LiF were used as starting materials. Raw materials are weighed to the formulations according to this invention shown in Table 1.

Compositions marked with * are comparative examples and out of the present invention. The materials weighed were wet-mixed using deionized water in attrition mill and the dried cake was calcined at 750~875° C. for 2 Hours. The calcined materials were ground in attrition mill to reduce particle size to a mean size of about 0.8 micron. Milled powders were dried and granulated with 10% PVA solution. PVA content was 2 weight % of the milled powders. Green disks of 25 mm in diameter and about 2.5 mm in thickness were formed with granulated powders at a pressure of 1,000 Kg/cm². The compressed green disks were sintered at 920~1000° C. for 2 hours. Ag paste was printed on both faces and fired at 700~820° C. for 15 minutes. Electroded disks were polarized at 3~4 kV/mm in silicone oil bath of 120~140° C. for 15 minutes. Dielectric constant and dielectric loss tangent was measured using LCR meter at 1 kHz. The piezoelectric modulus $d_{33}$ was measured using a Berlincourt $d_{33}$ meter. The planar coupling coefficient and mechanical quality factor were calculated from resonant frequency, anti-resonant frequency, resonance impedance measured with Impedance/Gain-Phase analyser and capacitance measured with LCR meter. Density was calculated from the diameter, the thickness and the weight measured. Measured characteristics of the samples in Table 2,3,4 and 5.

TABLE 1

Compositions of the preferred embodiment according to this invention

| Sample # | M | n | x | y | a | b | p | q | r |
|---|---|---|---|---|---|---|---|---|---|
| 1 | 0.0 | 0 | 0.535 | 0.02 | 0.01 | 0.0067 | 0.80 | 0.20 | 0.16 |
| 2 | 0.0 | 0.025 | 0.535 | 0.02 | 0.01 | 0.0067 | 0.80 | 0.20 | 0.16 |
| 3 | 0.0 | 0 | 0.535 | 0.02 | 0.01 | 0.0067 | 1.2 | 0.20 | 0.16 |
| 4 | 0.0 | 0 | 0.535 | 0.02 | 0.01 | 0.0067 | 1.6 | 0.20 | 0.16 |
| 5 | 0.0 | 0 | 0.535 | 0.02 | 0.01 | 0.0067 | 1.2 | 0.00 | 0.16 |
| 6 | 0.0 | 0 | 0.535 | 0.02 | 0.01 | 0.0067 | 1.2 | 0.50 | 0.16 |
| 7 | 0.0 | 0 | 0.535 | 0.02 | 0.01 | 0.0067 | 1.2 | 1.00 | 0.16 |

TABLE 1-continued

Compositions of the preferred embodiment according to this invention

| Sample # | M | n | x | y | a | b | p | q | r |
|---|---|---|---|---|---|---|---|---|---|
| 8 | 0.0 | 0 | 0.535 | 0.02 | 0.01 | 0.0067 | 1.2 | 0.20 | 0.00 |
| 9 | 0.0 | 0 | 0.535 | 0.02 | 0.01 | 0.0067 | 1.2 | 0.20 | 0.50 |
| 10 | 0.0 | 0 | 0.535 | 0.02 | 0.01 | 0.0067 | 1.2 | 0.20 | 1.00 |
| 11 | 0.0 | 0 | 0.535 | 0.02 | 0.01 | 0.0067 | 1.2 | 0.20 | 1.50 |
| 13 | 0.0 | 0 | 0.535 | 0.03 | 0.015 | 0.0100 | 1.2 | 0.20 | 0.16 |
| 14 | 0.0 | 0 | 0.535 | 0.04 | 0.02 | 0.0130 | 1.2 | 0.20 | 0.16 |
| 15 | 0.0 | 0.025 | 0.535 | 0.02 | 0.01 | 0.0067 | 1.2 | 0.20 | 0.16 |
| 16 | 0 | 0.06 | 0.535 | 0.02 | 0.01 | 0.0067 | 1.2 | 0.20 | 0.16 |
| 17 | 0.1 | 0 | 0.535 | 0.02 | 0.01 | 0.0067 | 1.2 | 0.20 | 0.16 |
| 18 | 0.0 | 0 | 0.515 | 0.02 | 0.01 | 0.0067 | 1.2 | 0.20 | 0.16 |
| 19 | 0.0 | 0 | 0.525 | 0.02 | 0.01 | 0.0067 | 1.2 | 0.20 | 0.16 |
| 20 | 0.0 | 0 | 0.545 | 0.02 | 0.01 | 0.0067 | 1.2 | 0.20 | 0.16 |
| 21 | 0.0 | 0 | 0.555 | 0.02 | 0.01 | 0.0067 | 1.2 | 0.20 | 0.16 |
| 22 | 0.0 | 0 | 0.53 | 0.02 | 0.01 | 0.0067 | 1.2 | 0.20 | 1.00 |
| 23 | 0.0 | 0 | 0.525 | 0.02 | 0.01 | 0.0067 | 1.2 | 0.20 | 1.00 |
| 24 | 0.0 | 0 | 0.525 | 0.02 | 0.01 | 0.0067 | 1.2 | 0.20 | 1.50 |
| 25 | 0.0 | 0 | 0.520 | 0.02 | 0.01 | 0.0067 | 1.2 | 0.20 | 1.00 |
| 26 | 0.0 | 0 | 0.510 | 0.02 | 0.01 | 0.0067 | 1.2 | 0.20 | 1.00 |
| 27 | 0.0 | 0 | 0.500 | 0.02 | 0.01 | 0.0067 | 1.2 | 0.20 | 1.00 |
| 30 | 0.0 | 0 | 0.535 | 0.025 | 0.012 | 0.0125 | 1.2 | 0.20 | 0.16 |
| 31* | 0.0 | 0 | 0.535 | 0.025 | 0.025 | 0.0083 | 1.2 | 0.20 | 0.16 |
| 32 | 0.0 | 0 | 0.535 | 0.025 | 0.016 | 0.0083 | 1.2 | 0.20 | 0.16 |
| 33 | 0.0 | 0 | 0.525 | 0.025 | 0.012 | 0.0125 | 1.2 | 0.20 | 0.16 |
| 34* | 0.0 | 0 | 0.525 | 0.025 | 0.025 | 0.0083 | 1.2 | 0.20 | 0.16 |
| 35 | 0.0 | 0 | 0.525 | 0.025 | 0.016 | 0.0083 | 1.2 | 0.20 | 0.16 |
| 40 | 0.0 | 0.07 | 0.525 | 0.025 | 0.012 | 0.0083 | 1.2 | 0.20 | 0.16 |
| 41 | 0.0 | 0.07 | 0.535 | 0.025 | 0.012 | 0.0083 | 1.2 | 0.20 | 0.16 |
| 50 | 0.0 | 0 | 0.535 | 0.020 | 0.010 | 0.015 | 1.2 | 0.20 | 0.16 |
| 51 | 0.0 | 0 | 0.535 | 0.020 | 0.006 | 0.0150 | 1.2 | 0.20 | 0.16 |
| 52 | 0.0 | 0 | 0.535 | 0.020 | 0.006 | 0.0125 | 1.2 | 0.20 | 0.16 |
| 53 | 0.0 | 0 | 0.535 | 0.020 | 0.000 | 0.0150 | 1.2 | 0.20 | 0.16 |
| 54* | 0.0 | 0 | 0.535 | 0.020 | 0.010 | 0.0000 | 1.2 | 0.20 | 0.16 |
| 55 | 0.0 | 0 | 0.535 | 0.000 | 0.010 | 0.0150 | 1.2 | 0.20 | 0.16 |
| 56 | 0.0 | 0 | 0.535 | 0.040 | 0.010 | 0.0067 | 1.2 | 0.20 | 0.16 |

Table 2 characteristics of preferred embodiments in the Table 1 which are sintered at 985° C.

| | p(g/cm) | $\epsilon_{33}^T/\epsilon_0$ | tan δ | $K_p$ | $Q_m$ | $d_{33}$ |
|---|---|---|---|---|---|---|
| 1 | 7.62 | 2410 | 0.018 | 0.66 | 59 | 526 |
| 2 | 7.43 | 1905 | 0.018 | 0.61 | 62 | 455 |
| 3 | 7.58 | 2540 | 0.017 | 0.65 | 58 | 523 |
| 4 | 7.53 | 2250 | 0.020 | 0.66 | 57 | 574 |
| 5 | 7.56 | 2360 | 0.018 | 0.66 | 54 | 552 |
| 6 | 7.53 | 2190 | 0.018 | 0.67 | 56 | 548 |
| 7 | 7.56 | 2020 | 0.018 | 0.65 | 61 | 510 |
| 8 | 7.55 | 2330 | 0.019 | 0.66 | 55 | 544 |
| 9 | 7.45 | 1550 | 0.013 | 0.60 | 84 | 396 |
| 10 | 7.38 | 1440 | 0.015 | 0.59 | 88 | 386 |
| 11 | 7.37 | 1540 | 0.020 | 0.55 | 81 | 398 |
| 13 | 7.50 | 1960 | 0.020 | 0.65 | 56 | 509 |
| 14 | 7.58 | 2330 | 0.010 | 0.61 | 45 | 492 |
| 15 | 7.59 | 1680 | 0.018 | 0.65 | 66 | 461 |
| 16 | 7.61 | 1060 | 0.021 | 0.61 | 78 | 317 |
| 17 | 7.47 | 2820 | 0.004 | 0.58 | 60 | 481 |
| 18 | 7.57 | 2140 | 0.014 | 0.60 | 74 | 452 |
| 19 | 7.60 | 2460 | 0.016 | 0.64 | 66 | 533 |
| 20 | 7.57 | 1350 | 0.020 | 0.63 | 72 | 422 |
| 21 | 7.54 | 1060 | 0.022 | 0.60 | 78 | 340 |
| 22 | 7.43 | 1800 | 0.019 | 0.58 | 74 | 421 |
| 23 | 7.45 | 1954 | 0.016 | 0.60 | 77 | 450 |
| 24 | 7.35 | 1755 | 0.015 | 0.58 | 64 | 428 |
| 25 | 7.45 | 1985 | 0.013 | 0.61 | 75 | 473 |
| 26 | 7.50 | 1777 | 0.013 | 0.58 | 82 | 400 |
| 27 | 7.43 | 1620 | 0.010 | 0.54 | 95 | 346 |
| 30 | 7.47 | 2230 | 0.021 | 0.65 | 68 | 540 |
| 31* | 7.36 | 1655 | 0.028 | 0.40 | 76 | 276 |
| 32 | 7.41 | 1705 | 0.021 | 0.42 | 76 | 283 |
| 33 | 7.57 | 2570 | 0.014 | 0.61 | 70 | 475 |
| 34* | 7.36 | 1500 | 0.024 | 0.32 | 85 | 206 |
| 35 | 7.40 | 1640 | 0.020 | 0.37 | 86 | 221 |
| 40 | 7.35 | 3210 | 0.007 | 0.51 | 52 | 467 |
| 41 | 7.42 | 3400 | 0.014 | 0.50 | 43 | 455 |
| 50 | 7.61 | 2460 | 0.004 | 0.63 | 58 | 553 |
| 51 | 7.62 | 2380 | 0.004 | 0.60 | 60 | 513 |
| 52 | 7.62 | 2380 | 0.004 | 0.63 | 61 | 510 |
| 53 | 7.62 | 2210 | 0.006 | 0.55 | 63 | 435 |
| 54* | 7.44 | 1440 | 0.011 | 0.33 | 83 | 210 |
| 55 | 7.56 | 2255 | 0.003 | 0.65 | 71 | 535 |
| 56 | 7.60 | 2305 | 0.008 | 0.60 | 51 | 508 |

When sintered at 985° C., as shown in Table 2, the following characteristics were obtained:

$d_{33}$=317~574, Kp=0.42~0.67, $\epsilon_{33}^T/\epsilon 0$=1060~3210

Table 3 Characteristics of preferred embodiments in the Table 1 which were at 960° C.

| | p(g/cm³) | $\epsilon_{33}^T/\epsilon_0$ | tan δ | $K_p$ | $Q_m$ | $d_{33}$ |
|---|---|---|---|---|---|---|
| 1 | 6.34 | 1300 | 0.058 | 0.50 | 76 | 419 |
| 2 | 7.15 | 1460 | 0.019 | 0.40 | 78 | 256 |
| 3 | 7.48 | 2245 | 0.009 | 0.60 | 50 | 478 |
| 4 | 7.53 | 2310 | 0.020 | 0.65 | 61 | 525 |
| 5 | 7.51 | 2260 | 0.020 | 0.64 | 61 | 509 |
| 6 | 7.48 | 2100 | 0.020 | 0.65 | 60 | 500 |
| 7 | 7.54 | 2100 | 0.023 | 0.56 | 64 | 375 |
| 8 | 7.48 | 2340 | 0.020 | 0.63 | 61 | 510 |
| 9 | 7.51 | 1580 | 0.015 | 0.62 | 84 | 407 |
| 10 | 7.42 | 1610 | 0.020 | 0.57 | 81 | 394 |
| 11 | 7.35 | 1660 | 0.023 | 0.51 | 78 | 345 |
| 13 | 7.58 | 2200 | 0.021 | 0.64 | 57 | 526 |
| 14 | 7.50 | 2120 | 0.029 | 0.61 | 54 | 469 |
| 15 | 7.50 | 1660 | 0.023 | 0.63 | 64 | 414 |
| 16 | 7.54 | 1120 | 0.024 | 0.59 | 74 | 326 |
| 17 | 7.44 | 2875 | 0.004 | 0.60 | 58 | 500 |
| 18 | 7.55 | 2185 | 0.014 | 0.59 | 73 | 428 |
| 19 | 7.56 | 2440 | 0.015 | 0.64 | 65 | 518 |
| 20 | 7.57 | 1400 | 0.020 | 0.64 | 70 | 405 |
| 21 | 7.58 | 1050 | 0.021 | 0.58 | 79 | 333 |
| 22 | 7.34 | 1680 | 0.019 | 0.58 | 83 | 400 |
| 23 | 7.42 | 1770 | 0.014 | 0.61 | 81 | 432 |
| 24 | 7.31 | 1710 | 0.015 | 0.58 | 86 | 412 |
| 25 | 7.45 | 1880 | 0.014 | 0.61 | 81 | 455 |
| 26 | 7.45 | 1810 | 0.013 | 0.58 | 71 | 379 |
| 27 | 7.46 | 1630 | 0.011 | 0.55 | 92 | 354 |
| 30 | 7.41 | 2000 | 0.004 | 0.58 | 65 | 483 |
| 31* | 6.96 | 1260 | 0.052 | 0.37 | 76 | 255 |
| 32 | 7.44 | 1640 | 0.010 | 0.53 | 70 | 425 |
| 33 | 7.48 | 2470 | 0.002 | 0.63 | 64 | 502 |
| 34* | 7.22 | 1545 | 0.015 | 0.41 | 75 | 281 |
| 35 | 7.45 | 1980 | 0.004 | 0.57 | 66 | 466 |
| 40 | 7.35 | 3470 | 0.011 | 0.57 | 50 | 546 |
| 41 | 7.41 | 3650 | 0.016 | 0.55 | 42 | 511 |
| 50 | 7.54 | 2410 | 0.007 | 0.62 | 58 | 505 |
| 51 | 7.61 | 2275 | 0.008 | 0.55 | 60 | 469 |
| 52 | 7.62 | 2250 | 0.008 | 0.61 | 63 | 493 |
| 53 | 7.51 | 2050 | 0.024 | 0.52 | 63 | 367 |
| 54* | 7.11 | 1305 | 0.031 | 0.33 | 79 | 204 |
| 55 | 7.32 | 1940 | 0.021 | 0.61 | 69 | 473 |
| 56 | 7.45 | 2055 | 0.023 | 0.62 | 52 | 482 |

When sintered at 960° C., as shown in Table 3, the following characteristics were obtained:

$d_{33}$=326~526, Kp=0.52~0.65, $\epsilon_{33}^T/\epsilon 0$=1580~2470

Table 4 Characteristics of preferred embodiments in the Table 1 which were at 950° C.

| | p(g/cm³) | $\epsilon_{33}^T/\epsilon_0$ | tanδ | $K_p$ | $Q_m$ | $d_{33}$ |
|---|---|---|---|---|---|---|
| 1 | 6.53 | 1410 | 0.055 | 0.53 | 68 | 426 |
| 2 | 7.27 | 1760 | 0.004 | 0.58 | 67 | 430 |
| 3 | 7.56 | 2150 | 0.006 | 0.65 | 60 | 470 |
| 4 | 7.46 | 2200 | 0.008 | 0.66 | 66 | 494 |
| 5 | 7.52 | 2200 | 0.008 | 0.63 | 62 | 493 |
| 6 | 7.57 | 2190 | 0.008 | 0.66 | 64 | 510 |
| 7 | 7.43 | 2000 | 0.008 | 0.64 | 65 | 452 |
| 8 | 7.52 | 2200 | 0.007 | 0.65 | 63 | 485 |
| 9 | 7.52 | 1620 | 0.002 | 0.63 | 70 | 394 |
| 10 | 7.48 | 1400 | 0.003 | 0.60 | 90 | 386 |
| 11 | 7.34 | 1600 | 0.008 | 0.52 | 80 | 361 |
| 13 | 7.56 | 2270 | 0.009 | 0.65 | 58 | 500 |
| 14 | 7.55 | 2400 | 0.013 | 0.58 | 55 | 450 |
| 15 | 7.53 | 1750 | 0.011 | 0.64 | 64 | 440 |
| 16 | 7.60 | 1155 | 0.022 | 0.59 | 75 | 330 |
| 17 | 7.42 | 2800 | 0.004 | 0.60 | 59 | 507 |
| 18 | 7.58 | 2220 | 0.002 | 0.59 | 70 | 435 |
| 19 | 7.54 | 2400 | 0.004 | 0.62 | 64 | 470 |
| 20 | 7.59 | 1500 | 0.008 | 0.59 | 68 | 430 |
| 21 | 7.56 | 1190 | 0.009 | 0.61 | 72 | 368 |
| 22 | 7.40 | 2010 | 0.028 | 0.43 | 62 | 310 |
| 23 | 7.42 | 2020 | 0.027 | 0.44 | 65 | 340 |
| 24 | 7.34 | 1910 | 0.029 | 0.37 | 70 | 266 |
| 25 | 7.44 | 2050 | 0.025 | 0.41 | 68 | 290 |
| 26 | 7.37 | 1860 | 0.016 | 0.50 | 80 | 340 |
| 27 | 7.45 | 1740 | 0.018 | 0.36 | 83 | 240 |
| 30 | 7.51 | 2090 | 0.019 | 0.63 | 59 | 477 |
| 31* | 7.36 | 1640 | 0.022 | 0.40 | 77 | 276 |
| 32 | 7.14 | 1425 | 0.026 | 0.41 | 82 | 266 |
| 33 | 7.57 | 2410 | 0.017 | 0.62 | 65 | 473 |
| 34* | 7.67 | 1424 | 0.038 | 0.34 | 94 | 213 |
| 35 | 7.53 | 1540 | 0.024 | 0.32 | 83 | 185 |
| 40 | 7.34 | 3240 | 0.010 | 0.52 | 50 | 471 |
| 41 | 7.43 | 3630 | 0.013 | 0.57 | 41 | 559 |
| 50 | 7.53 | 1930 | 0.004 | 0.56 | 69 | 439 |
| 51 | 7.50 | 2100 | 0.005 | 0.64 | 47 | 483 |
| 52 | 7.59 | 1990 | 0.009 | 0.58 | 65 | 411 |
| 53 | 7.54 | 1990 | 0.020 | 0.51 | 72 | 381 |
| 54* | 7.17 | 1250 | 0.038 | 0.31 | 88 | 189 |
| 55 | 7.54 | 1985 | 0.019 | 0.61 | 71 | 481 |
| 56 | 7.60 | 2190 | 0.023 | 0.57 | 57 | 457 |

When sintered at 950° C., as shown in Table 4, the following characteristics were obtained:

$d_{33}$=266~559, Kp=0.32~0.66, $\epsilon_{33}^T/\epsilon 0$=1155~3630

When sintered at 938° C., as shown in Table 5, the following characteristics were obtained:

| | p(g/cm³) | $\epsilon_{33}^T/\epsilon_0$ | tanδ | $K_p$ | $Q_m$ | $d_{33}$ |
|---|---|---|---|---|---|---|
| 1 | 7.57 | 2170 | 0.021 | 0.65 | 60 | 457 |
| 2 | 7.20 | 1600 | 0.018 | 0.56 | 68 | 441 |
| 3 | 7.54 | 2100 | 0.019 | 0.63 | 60 | 518 |
| 4 | 7.64 | 2100 | 0.008 | 0.64 | 64 | 490 |
| 5 | 7.54 | 2050 | 0.008 | 0.62 | 62 | 455 |
| 6 | 7.66 | 2000 | 0.007 | 0.64 | 69 | 490 |
| 7 | 7.60 | 1705 | 0.009 | 0.61 | 66 | 385 |
| 8 | 7.54 | 2100 | 0.007 | 0.63 | 63 | 460 |
| 9 | 7.41 | 1160 | 0.002 | 0.62 | 77 | 438 |
| 10 | 7.42 | 1460 | 0.034 | 0.59 | 89 | 390 |
| 11 | 7.35 | 1560 | 0.008 | 0.51 | 90 | 340 |
| 13 | 7.55 | 1900 | 0.009 | 0.65 | 64 | 490 |
| 14 | 7.56 | 1970 | 0.009 | 0.62 | 55 | 460 |
| 15 | 7.51 | 1700 | 0.010 | 0.61 | 66 | 430 |
| 16 | 7.49 | 1240 | 0.020 | 0.61 | 76 | 306 |
| 17 | 7.48 | 2700 | 0.003 | 0.59 | 59 | 485 |
| 18 | 7.56 | 2200 | 0.002 | 0.59 | 72 | 446 |
| 19 | 7.62 | 2300 | 0.004 | 0.62 | 66 | 474 |
| 20 | 7.58 | 1490 | 0.010 | 0.63 | 69 | 415 |
| 21 | 7.54 | 1155 | 0.021 | 0.60 | 78 | 354 |
| 22 | 7.43 | 1670 | 0.005 | 0.57 | 83 | 390 |
| 23 | 7.41 | 1760 | 0.004 | 0.60 | 76 | 423 |
| 24 | 7.36 | 1740 | 0.019 | 0.56 | 80 | 395 |
| 25 | 7.48 | 1890 | 0.018 | 0.59 | 76 | 453 |
| 26 | 7.43 | 1830 | 0.015 | 0.58 | 80 | 410 |
| 27 | 7.47 | 1700 | 0.013 | 0.53 | 90 | 355 |
| 30 | 7.24 | 2080 | 0.020 | 0.58 | 65 | 440 |
| 31* | 6.68 | 1232 | 0.107 | 0.38 | 90 | 264 |
| 32 | 6.90 | 1270 | 0.059 | 0.38 | 89 | 251 |
| 33 | 7.48 | 2320 | 0.016 | 0.61 | 66 | 479 |
| 34* | 6.70 | 1400 | 0.249 | 0.32 | 75 | 227 |
| 35 | 7.50 | 1490 | 0.020 | 0.26 | 98 | 156 |
| 40 | 7.39 | 3190 | 0.026 | 0.56 | 49 | 495 |
| 41 | 7.37 | 3420 | 0.030 | 0.57 | 42 | 560 |
| 50 | 7.57 | 2235 | 0.021 | 0.61 | 63 | 498 |
| 51 | 7.62 | 2020 | 0.020 | 0.60 | 64 | 456 |
| 52 | 7.57 | 1990 | 0.019 | 0.60 | 64 | 463 |
| 53 | 7.52 | 1985 | 0.022 | 0.51 | 67 | 378 |
| 54* | 7.06 | 1306 | 0.011 | 0.32 | 78 | 199 |
| 55 | 7.47 | 1890 | 0.021 | 0.62 | 72 | 471 |
| 56 | 7.51 | 1990 | 0.022 | 0.61 | 56 | 482 |

When sintered at 938° C., as shown in Table 5, the following characteristics were obtained:

$d_{33}$=156~560, Kp=0.26~0.65, $\epsilon_{33}^{T/}0$=1155~3420

As shown in Table 2–5, the samples in accordance with the present invention show good characteristics of typical soft piezoelectric ceramic materials when sintered at below 990° C., i.e. high $d_{33}$, high Kp, high dielectric constant, etc. Many compositions show good piezoelectric parameters even when sintered below 960° C. and thus it becomes possible to cofire them with pure Ag internal electrodes.

Wide range of $d_{33}$, $\epsilon_{33}^T/\epsilon 0$ and Kp can be achieved by varying concentration of Sr, Ba, Bi, Ni, W and sintering additives according to this invention as can be seen from the characteristics in Table 2–5. Compositions in Table 1 are only exemplary and many other compositions can be made with good parameters.

EXAMPLE 2

Multi-Layered Piezoelectric Ceramic Stack

Figure 2:
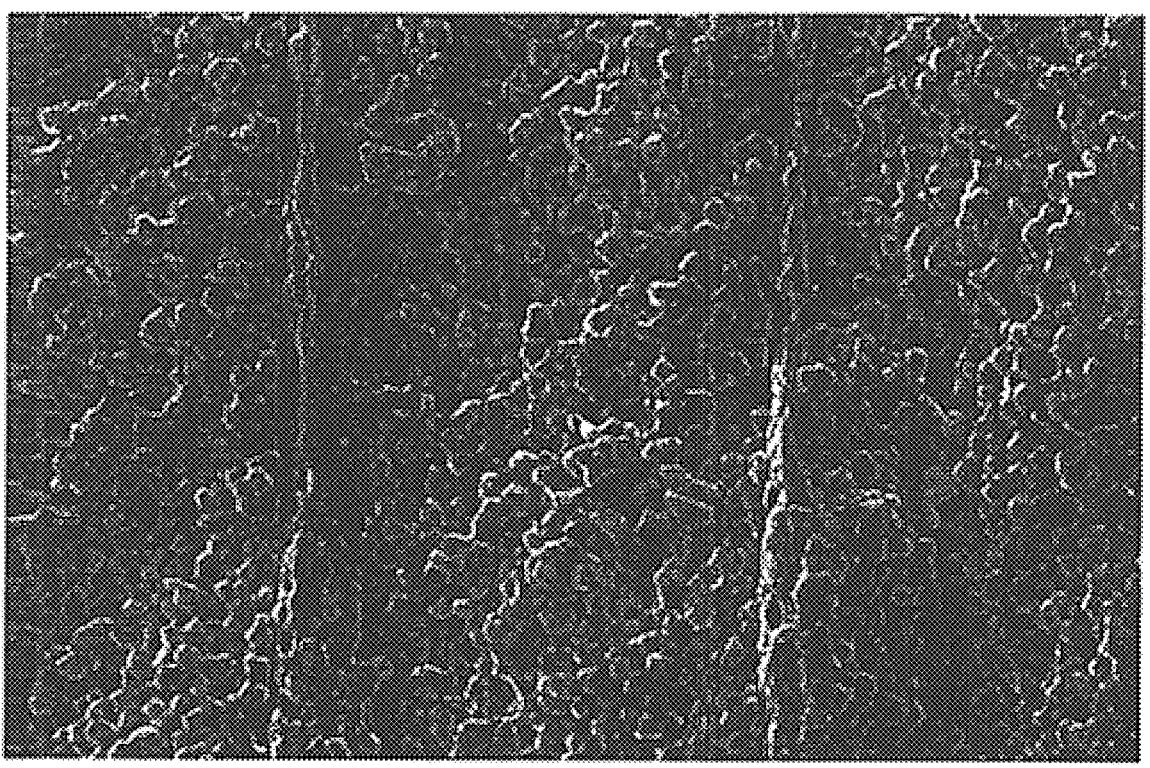
FIG. 2. is the cross-sectional view of multi-layered piezoelectric plates co-fired with pure Ag internal electrode.
Figure 3:
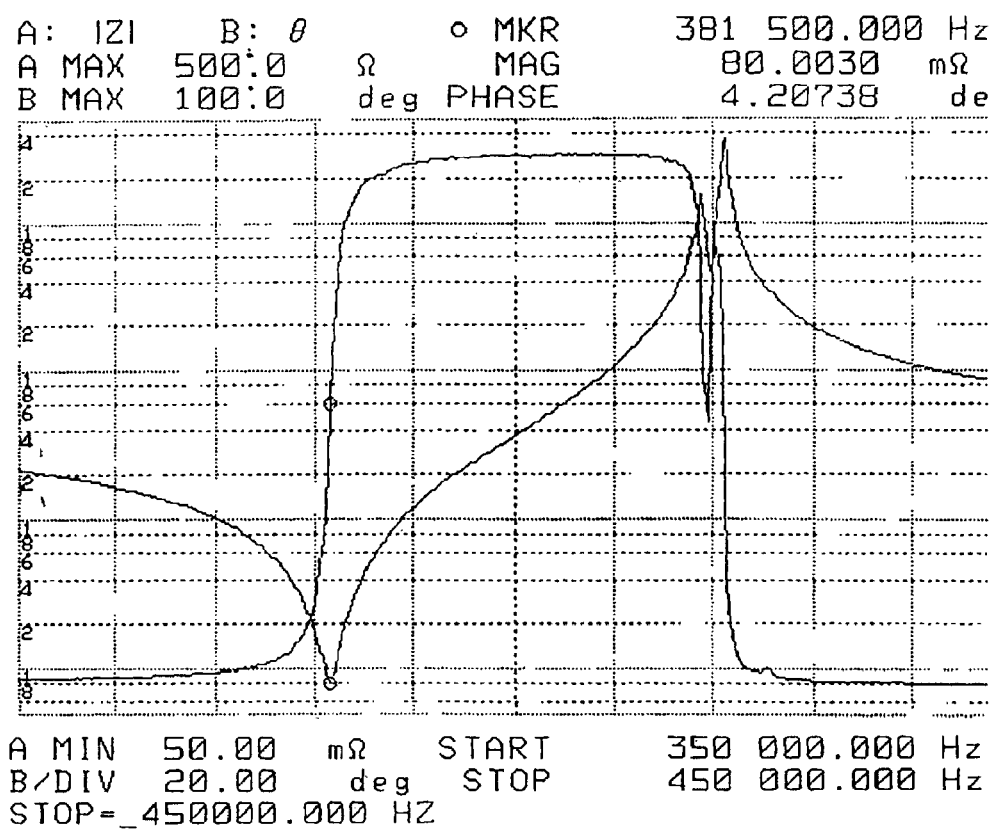
FIG. 3. is a graphical illustration showing impedance/phase characteristics of the plate made according to the present invention.

Multi-layer piezoelectric ceramic plates with pure Ag internal electrode were built with the compositions according to the present invention. The composition #3 was chosen as an example. Manufacturing of multi-layer piezoelectric ceramic plates consist of synthesis of piezoelectric ceramic materials, manufacturing of green sheet, electrode pattern printing, multi-layer stacking, cofiring of stacked green bar, external termination with Ag paste and poling. Calcined material is mixed in a ball mill for 36 hours with a binder solution consisted of PVB(Polyvinyl Butyral), DBP(Dibutyl Phthalate), Fish oil, MEK and toluene. Milled slurry was deaired under vacuum and cast into tapes of 120 microns thick on PET film using a doctor blade casting machine. Green tape was cut into sheets of 150 mm×150 mm with aligning holes. Alternating patterns of internal electrodes were printed on green sheets using pure Ag paste and dried in continuous oven. Printed green sheets were stacked in registry with aligning holes and hot pressed under vacuum at 85° C. Hot-laminated green bars were cut into separate green elements. Binders as well as the other organics in the green elements were burnt out at 260° C. and sintered at 940° C. for 2 hours. External electrodes were screen-printed with Ag paste and fired at 780° C. Polarization was done in silicone oil bath at 130° C. with a poling voltage of 450 VDC. Size of the piezoelectric ceramic plates was 5.13 mm×5.13 mm×1.04 mm and it has 20 internal electrodes with 19 piezo-active layers. The thickness of each layer was 50 microns and the cover sheets were put on the top and the bottom of the plate. FIG. 1 and FIG. 2 show the cross-sectional view of multi-layered piezoelectric plates co-fired with pure Ag internal electrode. Coverage of Ag internal electrode was excellent without noticeable pores or delamination and resulted in very small resonance impedance and excellent piezoelectric properties. There were no noticeable reaction of Ag paste with the PZT matrix made of the composition #3 according to the present invention even in cofiring at 950° C. FIG. 3 shows impedance/phase characteristics of the plate made. Resonance frequency corresponding to the width of the plate is 381.5 kHz and resonance frequency is 80 mΩ. Maximum phase angle is 87.26 degrees.

In the addition to pure Ag internal electrode, the multi-layered piezoelectric transformers can be produced with the materials according to this invention utilizing Ag—Pd internal electrode with a Pd content less than 20 weight of Ag and Pd.

This multi-layered piezoelectric ceramic plate is only an exemplary and many other multi-layered devices can be built with pure Ag internal electrodes by cofiring the low-temperature firable materials in accordance with the current invention, for examples, multi-layer stack actuators, multi-layer sensors, multi-layered bimorphs, etc.

I claim:

1. A soft piezoelectric ceramic composition comprising:

[$(Pb_{1-m-n}Sr_mBa_n)_{(1-y)}Bi_y$][$(Zr_xTi_{1-x})_{1-a-b}Ni_aW_b$]$O_3$+pCdO wherein m,n,x,y,a and b are molar ratio, p is wt % and are in ranges, repectively, $0.00 \leq m \leq 0.18$, $0.00 \leq n \leq 0.18$, $0.00 \leq (m+n) \leq 0.21$, $0.40 \leq x \leq 0.60$
$0.00 \leq y \leq 0.04$, $0.00 \leq a \leq 0.02$, $0.00 \leq b \leq 0.02$, $0.00 \leq p \leq 2.00$.

2. The soft piezoelectric ceramic composition according to claim 1, further comprising at least one sintering aid selected from the group consisting of PbO and LiF.

3. The soft piezoelectric ceramic composition according to claim 2, wherein the amount of said PbO is less than 2% by weight.

4. The soft piezoelectric ceramic composition according to claim 2, wherein the amount of said LiF is less than 1.6% by weight.

5. The soft piezoelectric ceramic composition according to claim 1, wherein the ratio of y, a and b is 1: 0.5~1: 0.33~0.5.

6. The soft piezoelectric ceramic composition according to claim 2, wherein the ratio of y, a and b is 1: 0.5~1: 0.33~0.5.

7. A piezoelectric ceramic device comprising: a piezoelectric ceramic comprising a piezoelectric ceramic composition according to claim 1, sintered below 980° C.

8. A piezoelectric ceramic device comprising: a piezoelectric ceramic comprising a piezoelectric ceramic composition according to claim 2, sintered below 980° C.

9. A multi-layered piezoelectric ceramic device comprising piezoelectric ceramic layer, wherein the piezoelectric ceramic layer comprising a piezoelectric ceramic composition according to claim 1, co-fired with pure Ag internal electrode below 960° C.

10. A multi-layered piezoelectric ceramic device comprising piezoelectric ceramic layer, wherein the piezoelectric ceramic layer comprising a piezoelectric ceramic composition according to claim 2, co-fired with pure Ag internal electrode below 960° C.

11. A multi-layered piezoelectric ceramic device comprising piezoelectric ceramic layer, wherein the piezoelectric ceramic layer comprising a piezoelectric ceramic composition according to claim 1, co-fired with Ag—Pd internal electrode below 1050° C.

12. The multi-layered piezoelectric ceramic device according to claim 11, wherein the amount of Pd is less than 20 weight % of the total weight of Ag and Pd.

13. A multi-layered piezoelectric ceramic device comprising piezoelectric ceramic layer, wherein the piezoelectric ceramic layer comprising a piezoelectric ceramic composition according to claim 2, co-fired with Ag—Pd internal electrode below 1050° C.

14. The multi-layered piezoelectric ceramic device according to claim 13, wherein the amount of Pd is less than 20 weight % of the total weight of Ag and Pd.

* * * * *